(12) United States Patent
Salter et al.

(10) Patent No.: US 10,164,631 B2
(45) Date of Patent: Dec. 25, 2018

(54) HOLOGRAPHIC PROXIMITY SWITCH

(71) Applicant: Ford Global Technologies, LLC, Dearborn, MI (US)

(72) Inventors: Stuart C. Salter, White Lake, MI (US); Paul Kenneth Dellock, Northville, MI (US); James J. Surman, Clinton Township, MI (US); David Brian Glickman, Southfield, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 267 days.

(21) Appl. No.: 15/347,015

(22) Filed: Nov. 9, 2016

(65) Prior Publication Data
US 2018/0131372 A1 May 10, 2018

(51) Int. Cl.
| | |
|---|---|
| H03K 17/955 | (2006.01) |
| B60Q 3/00 | (2017.01) |
| B60Q 3/02 | (2006.01) |
| G03H 1/22 | (2006.01) |
| G03H 1/26 | (2006.01) |
| H03K 17/945 | (2006.01) |
| G03H 1/00 | (2006.01) |

(52) U.S. Cl.
CPC .......... *H03K 17/955* (2013.01); *B60Q 3/004* (2013.01); *B60Q 3/0286* (2013.01); *G03H 1/2202* (2013.01); *G03H 1/265* (2013.01); G03H 2001/0055 (2013.01); G03H 2001/2226 (2013.01); G03H 2001/2231 (2013.01); G03H 2222/34 (2013.01); G03H 2223/16 (2013.01); H03K 2017/9455 (2013.01); H03K 2217/960785 (2013.01)

(58) Field of Classification Search
CPC ......... H03K 17/955; H03K 2017/9455; H03K 2217/960785; B60Q 3/004; B60Q 3/0286; B60Q 1/0076; B60Q 3/00; B60Q 3/60; B60Q 3/62; B60Q 3/70; B60Q 3/82; G03H 1/2202; G03H 1/265; G03H 2001/0055; G03H 2001/2226; G03H 2001/2231; G03H 2222/34; G03H 2223/16; F21S 41/24; F21S 41/20; F21S 41/60; F21S 43/235; F21V 23/04
See application file for complete search history.

(56) References Cited

U.S. PATENT DOCUMENTS

| | | | | |
|---|---|---|---|---|
| 4,818,048 | A * | 4/1989 | Moss | B60K 35/00 345/173 |
| 5,473,447 | A * | 12/1995 | Molteni | G02B 27/0103 359/13 |
| 6,114,954 | A | 9/2000 | Palett et al. | |
| 7,589,622 | B2 | 9/2009 | Farley | |
| 8,414,168 | B2 | 4/2013 | Jutila et al. | |
| (Continued) | | | | |

FOREIGN PATENT DOCUMENTS

JP 2000052859 2/2000

*Primary Examiner* — Bao Q Truong
(74) *Attorney, Agent, or Firm* — Vichit Chea; Price Heneveld LLP

(57) ABSTRACT

A vehicle switch is provided that includes a substrate. A holographic film is positioned on the substrate. A first light source and a second light source are configured to emit a light onto the film and a proximity switch assembly is positioned on the substrate. The holographic film is configured to create a projected image above the holographic film.

20 Claims, 4 Drawing Sheets

(56) References Cited

U.S. PATENT DOCUMENTS

| | | | |
|---|---|---|---|
| 8,985,414 B2 | 3/2015 | Aftanas | |
| 9,290,123 B2 | 3/2016 | Salter et al. | |
| 2010/0302794 A1* | 12/2010 | Oomen | B60Q 1/0017 |
| | | | 362/519 |
| 2016/0082880 A1 | 3/2016 | Co et al. | |
| 2017/0184270 A1* | 6/2017 | Kim | F21S 43/00 |

* cited by examiner

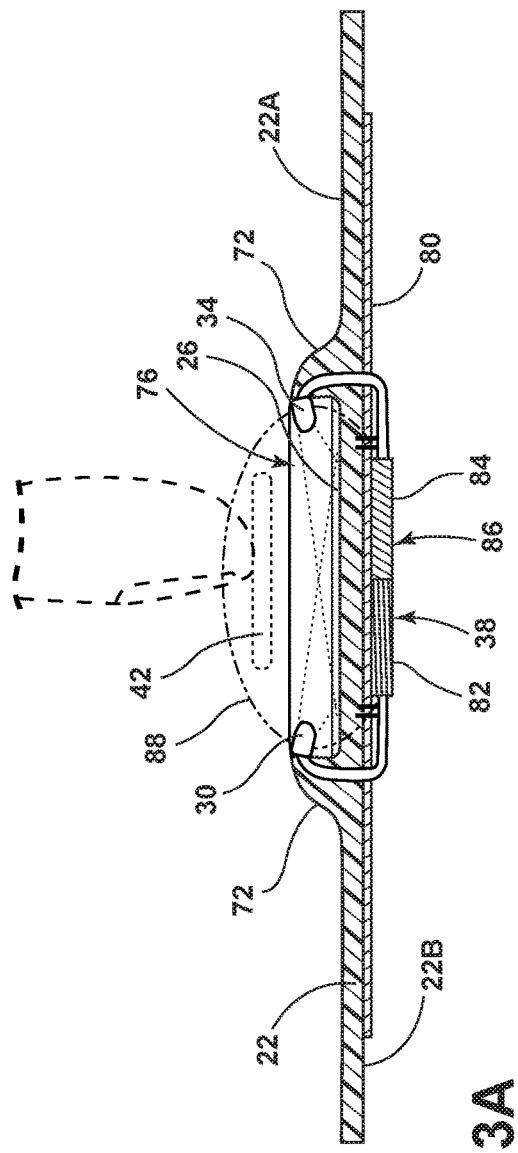
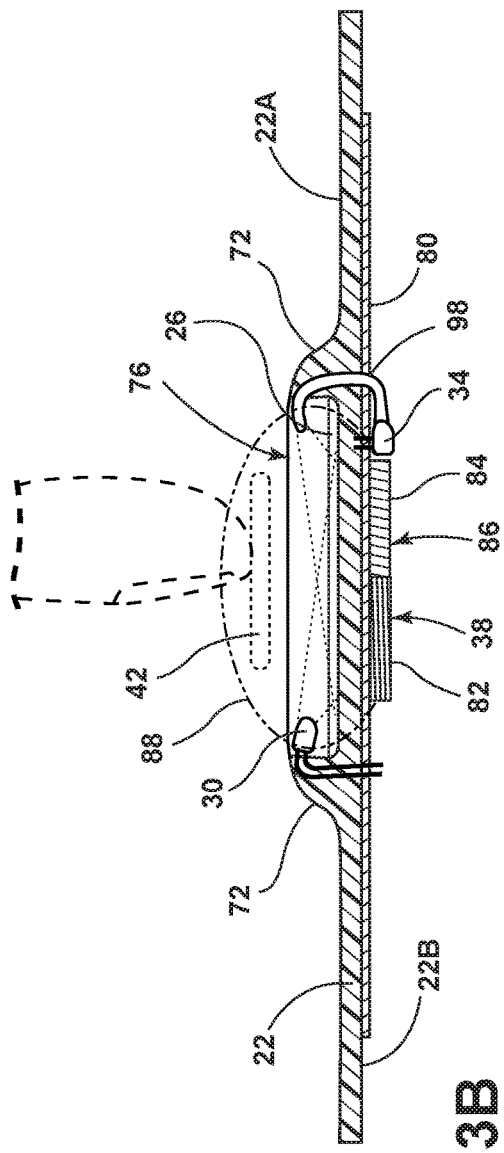
FIG. 3A
FIG. 3B

HOLOGRAPHIC PROXIMITY SWITCH

FIELD OF THE INVENTION

The present invention generally relates to switches, and more particularly, to holographic proximity switches.

BACKGROUND OF THE INVENTION

Vehicles typically include a variety of switches which control various functions of the vehicle. Illumination and designation of the switch may provide an aesthetically pleasing appearance to the vehicle.

SUMMARY OF THE INVENTION

According to one aspect of the present invention, a vehicle switch is provided that includes a substrate. A holographic film is positioned on the substrate. A first light source and a second light source are configured to emit a light onto the film and a proximity switch assembly is positioned on the substrate. The holographic film is configured to create a projected image above the holographic film.

According to another aspect of the present invention, a vehicle switch is provided that includes a substrate. A holographic film is positioned on the substrate. A first light source and a second light source are configured to emit a light onto the film and a proximity switch assembly is positioned on an opposite side of the substrate than the holographic film. The holographic film is configured to create a projected image.

According to yet another aspect of the present invention, a switch is provided that includes a substrate. A holographic film is positioned on the substrate. A light source is configured to emit a light onto the film and a proximity switch assembly is positioned on the substrate and configured to generate an activation field. The holographic film is configured to create a projected image within the activation field.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 3A is a cross-sectional view taken at line IIIA of FIG. 2, according to one embodiment;

FIG. 3B is a cross-sectional view taken at line IIIB of FIG. 2, according to one embodiment.

DETAILED DESCRIPTION OF THE PREFERRED EMBODIMENTS

Figure 1:
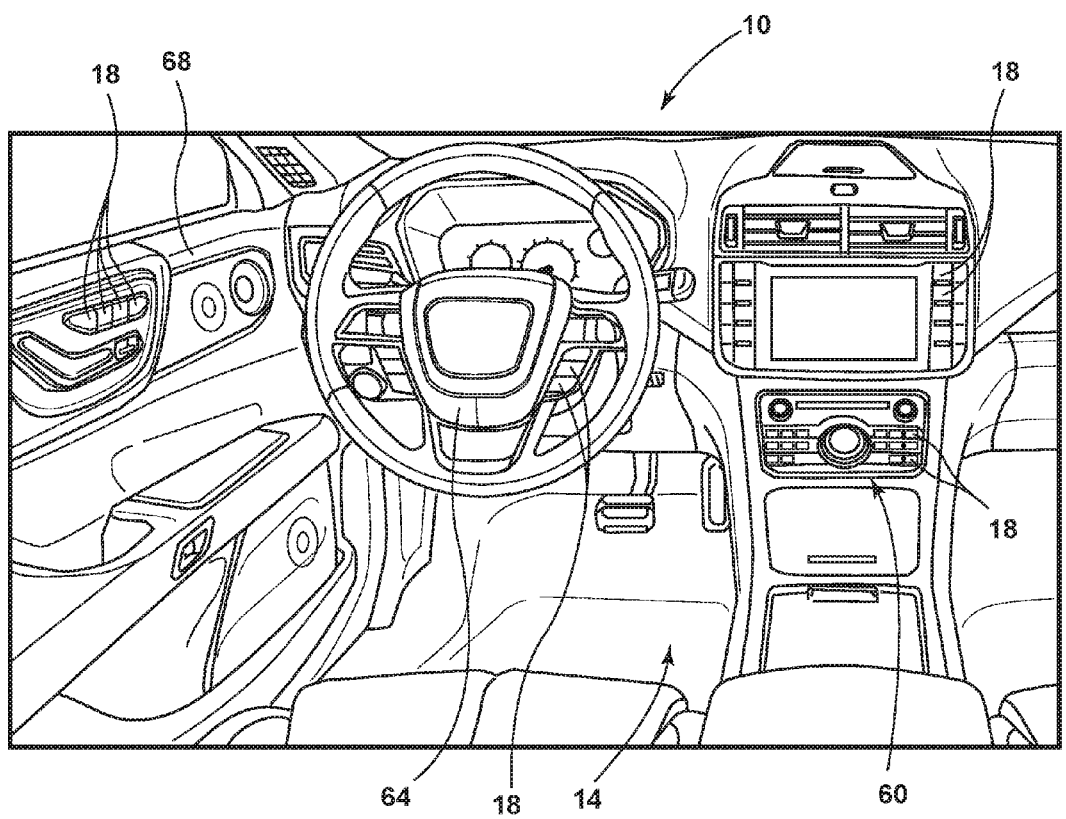
FIG. 1 is a perspective view of a passenger compartment of a vehicle, according to one embodiment.

Additional features and advantages of the invention will be set forth in the detailed description which follows and will be apparent to those skilled in the art from the description or recognized by practicing the invention as described in the following description together with the claims and appended drawings.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Referring to FIGS. 1-4, reference numeral 10 generally designates a vehicle. The vehicle 10 includes a vehicle interior 14 within which a switch 18 is positioned. It will be understood that although described in connection with the interior 14 of the vehicle 10, the switch 18 may additionally or alternatively be positioned on an exterior of the vehicle 10. The switch 18 includes a substrate 22 and a holographic film 26 which is positioned on the substrate 22. A first light source 30 and a second light source 34 are configured to emit light onto the holographic film 26. A proximity switch assembly 38 is positioned proximate the substrate 22. The holographic film 26 is configured to create a projected image 42 above the holographic film 26.

Figure 2:
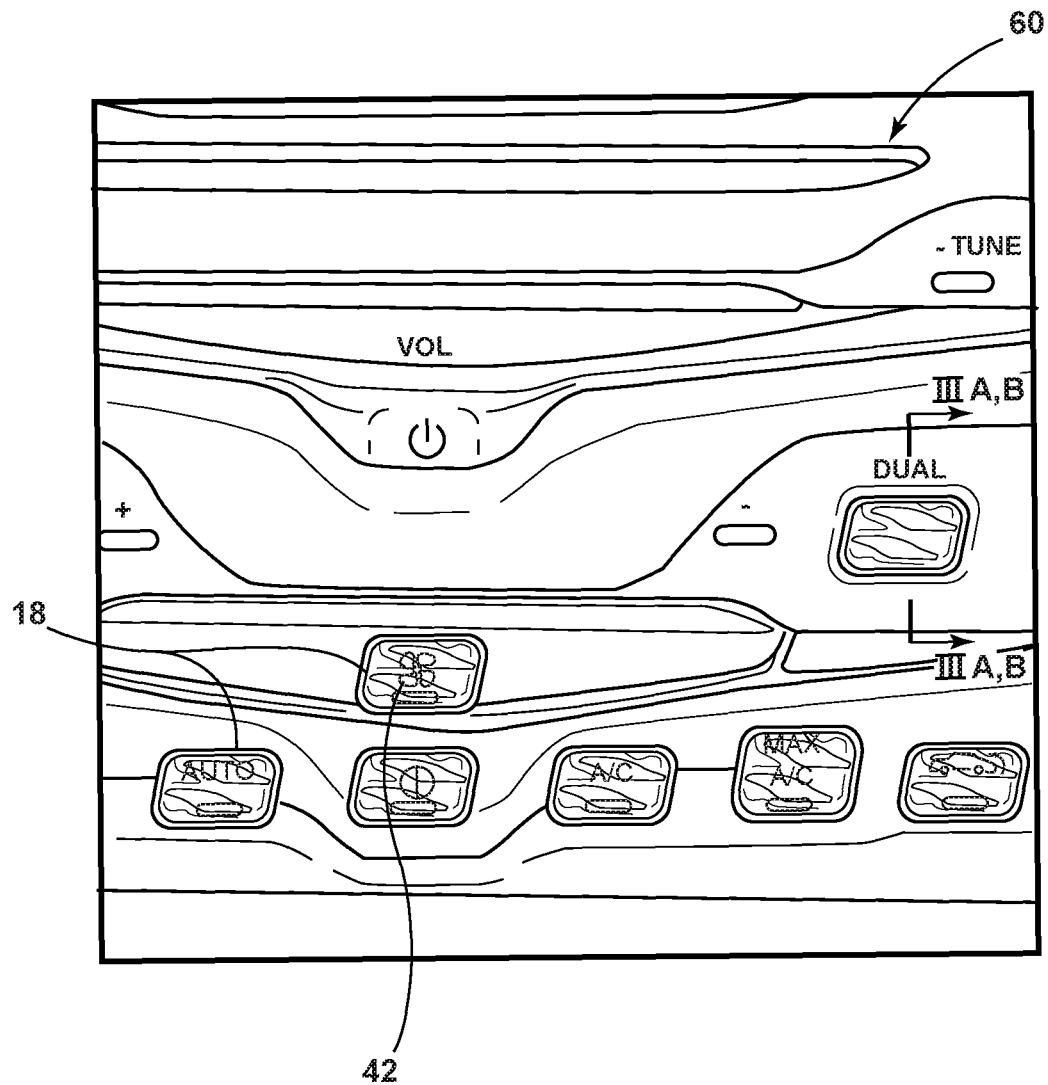
FIG. 2 is an enhanced view of switches of the vehicle, according to one embodiment.

Referring now to FIGS. 1 and 2, the interior 14 of the vehicle 10 defines a plurality of locations in which the switch 18 may be used and implemented. For example, within the interior 14 may be an infotainment system 60 including a plurality of switches 18, a steering wheel 64 incorporating a plurality of switches 18, and a door 68 incorporating a plurality of switches 18. The switches 18 may control such features of the vehicle 10 as window up/down, mirror adjustment, door locks, cruise control, volume, trip information, heads-up display adjustments, radio controls (e.g., seek, scan, media choice), air conditioning, fan speed, defrost and clock adjustment. Further, the switches 18 may be toggle buttons used for a selection on a display of the infotainment system 60. In embodiments of the vehicle 10 where the switch 18 is positioned on an exterior of the vehicle 10, the switch 18 may be used as an entry keypad, a locking feature, truck or tailgate activation, hood release and/or other switches which may be present on an exterior of the vehicle 10.

According to various embodiments, the switches 18 may be both configured to be illuminated and include the projected image 42. Illumination of the switches 18 may be desirable to both enhance the visibility of the switches 18 as well as to provide an aesthetically pleasing light. Further, the illumination from the switches 18 may provide an aesthetically pleasing ambient lighting to the interior 14 of the vehicle 10. The addition of the projected image 42 may serve to both designate the use or function of the switch 18, as well as provide an aesthetically pleasing appearance to the switch 18. As explained in greater detail below, the proximity switch assembly 38 (FIG. 3A) may configure the switch 18 to be activated by sensing the proximity of an occupant of the vehicle 10 close to the switch 18. For example, the approach and/or near touch of a finger of a vehicle occupant proximate the switch 18 may activate the switch 18 such that the appropriate function of the vehicle 10 is activated.

Referring now to the depicted embodiment of FIG. 3A, the switch 18 includes the substrate 22, the holographic film 26, the first light source 30, the second light source 34, and the proximity switch assembly 38. The substrate 22 may be composed of a polymeric material configured to function as a base for the various components of the switch 18. It will be understood that the substrate 22 may be composed of a variety of materials depending on the location of the switch 18 (e.g., metal, wood, etc.). The substrate 22 may include a variety of films, coatings, or colorants to provide an aesthetically pleasing appearance to the interior 14 or exterior of the vehicle 10. The substrate 22 defines a surround 72 which extends outwardly from an A-surface 22A of the substrate 22. It will be understood that the surround 72 may additionally or alternatively extend below the A-surface 22A of the substrate 22 without departing from the teachings provided herein. The surround 72 defines a well 76 within which the first light source 30, second light source 34 and holographic film 26 are positioned. Defined on opposite sides of the substrate 22 from the A-surface 22A is a B-surface 22B. The substrate 22 may be configured to allow various electro-magnetic fields and waves to pass therethrough. Positioned proximate the surround 72 are the first and second light sources 30, 34. The first and second light sources 30, 34 may be positioned within the well 76, on top of the surround 72 or at any location which permits the light from the first and second light sources 30, 34 to reach the holographic film 26. The first and second light sources 30, 34 may be incandescent bulbs, light-emitting diodes, electroluminescent devices and other sources of light. According to various embodiments, at least one of the first and second light sources 30, 34 are configured to emit coherent light (i.e., light having a constant phase difference and a substantially uniform frequency). The first and second light sources 30, 34 are configured to emit light onto the holographic film 26. In the depicted embodiment, the first and second light sources 30, 34 are positioned on opposite sides of the surround 72 such that the first and second light sources 30, 34 emit light onto the holographic film 26 from different directions. It will be understood that in alternative embodiments, the first and second light sources 30, 34 may be positioned next to one another such that the first and second light sources 30, 34 emit light onto the holographic film 26 from substantially the same direction. Further, it will also be understood that more than two light sources may be utilized to emit light onto the holographic film 26. The first and second light sources 30, 34 may emit white or a colored light. Further, the first and second light sources 30, 34 may be operated at the same time or in an alternating pattern to achieve various lighting effects. As explained in greater detail below, through emission of the light from the first and second light sources 30, 34, the first and second light sources 30, 34 and the holographic film 26 cooperate to produce the projected image 42. The projected image 42 may appear to "float" or "hover" over the switch 18.

The holographic film 26 may be a polymeric film having a plurality of features configured to form an interference pattern. The features of the holographic film 26 may be ridges, variations in opacity, density or surface profile. The holographic film 26 may be composed of polyethylene terephthalate, orientated polypropylene and/or polyvinyl chloride materials. The holographic film 26 may be metalized or transparent. The holographic film 26 may have a density of between about 70 gsm and about 450 gsm. Light from the first and/or second light sources 30, 34 falling on the interference pattern diffracts into a light field which forms the projected image 42. The projected image 42 may also be known as a hologram. The light field which forms the projected image 42 may exhibit visual depth queues such as parallax and perspective that change realistically with any change in the relative position of the observer (e.g., an occupant within the interior 14 of the vehicle 10). As the projected image 42 exhibits a depth and changes with changing perspective of the observer, the projected image 42 is a hologram. Use of embodiments of the switch 18 which incorporates multiple light sources (e.g., the first and second light sources 30, 34) around the surround 72 may be advantageous in providing a uniform appearance to the projected images 42 regardless of viewing perspective (e.g., driver seat vs. passenger seat) of the observer. In other words, a skewing of the projected image 42 based on the lighting may not occur, or be apparent to the viewer.

The projected image 42 may take a variety of configurations including alpha numeric text, symbols (e.g., related to the function of the switch 18 such as a fan, defrost lines, etc.), pictures, as well as graphical representations of electrical fields as explained in greater detail below. The projected image 42 may change color with a change in the color of light emitted from the first and/or second light sources 30, 34. Further, the projected image 42 may appear different from different angles and embodiments utilizing differently oriented or differently colored light sources 30, 34. For example, the intensity or color of the projected image 42 may vary based on the observer's seat position within the interior 14 of the vehicle 10. The intensity of the projected image 42 may be increased or decreased by a corresponding increase or decrease in light from the first and second light sources 30, 34. According to various embodiments, altering the activation of the first and second light sources 30, 34 may be configured to give the projected image 42 the appearance of movement. For example, by activating the first and second light sources 30, 34 in an alternating manner, the projected image 42 may be skewed in an alternating manner giving the appearance of movement. It will be understood that more than one holographic film 26 may be utilized and that a light source for each holographic film 26 may be present. In such an embodiment, the projected image 42 may change based on which light source is activated. Based on the lighting from the first and second light sources 30, 34, the projected image 42 may provide a 120° cone of image stand off from the switch 18 and/or the holographic film 26.

Positioned on the B-surface 22B of the substrate 22 is a printed circuit board 80. The printed circuit board 80 may be configured to power the first and second light sources 30, 34, as well as support and power the proximity switch assembly 38. The proximity switch assembly 38 may be operable to actuate the function of the switch 18. In some embodiments, the proximity switch assembly 38 is a single or a plurality of proximity sensor(s). Each of the sensor(s) may be configured to control at least one control output corresponding to a system or a device of the vehicle 10. In some embodiments, the proximity sensors may be implemented as capacitive sensors. However, it should be appreciated by those skilled in the art that other types of proximity sensors may be used in addition to and/or alternatively to any other practicable sensor. Other embodiments of the proximity sensors may include, but are not limited to, magnetic sensors, inductive sensors, optical sensors, resistive sensors, temperature sensors, the like, or any combination thereof.

Capacitive sensors detect changes in capacitance due to the placement or movement of an object such as a finger proximate to or in contact with the proximity switch assembly 38 (e.g., the switch 18). The user's finger may tap or swipe on or near the proximity switch assembly 38 to input a switching event. The proximity switch assembly 38 may be formed by a first portion 82 and a second portion 84 of a conductive layer 86. Capacitive sensors may be actuatable with substantially no force to realize switch activation. The actual sensitivity of this type of switch can be tuned via a detection circuit. Capacitive switches beneficially provide immunity to interference and eliminate the need for electromechanical switch gear (e.g., pushbuttons or sliding switches).

The proximity switch assembly 38 is configured to emit an activation field 88. The activation field 88 extends outwardly from the switch 18. According to various embodiments, the sensors of the proximity switch assembly 38 are activated when an object such as a finger proximate to or in contact with the switch 18 interferes with the activation field 88. The activation field 88 may extend over the projected image 42. The distance which the activation field 88 extends may be tuned. According to various embodiments, the activation field 88 may be an electric and/or magnetic field.

In operation, the projected image 42 may be configured to indicate to the observer or occupant of the interior 14 of the vehicle 10 the location which needs to be touched in order to activate the switch 18. In other words, the projected image 42 may indicate where to touch in order to activate the switch 18. For example, the projected image 42, as explained above, may graphically represent the activation field lines of the activation field 88 such that it is clear to an observer where the activation space for the switch 18 is and where it is not. In other words, the projected image 42 is displayed in within the activation field 88. In such an embodiment, a printed indicia (e.g., film or paint) may be positioned on top of the holographic film 26 or substrate 22 to indicate the function of the switch 18. In another embodiment, the projected image 42 may correspond to a graphical depiction of the function of the switch 18. For example, an air conditioner embodiment of the switch 18 may be represented by the projected image 42 of "A/C" or a fan speed embodiment of the switch 18 may be represented by a fan shape for the projected image 42. In such embodiments, the projected image 42 may still serve to indicate to a user of the switch 18 how close their finger needs to be to activate the switch 18. For example, the holographic film 26 may be configured to create the projected image 42 at a farthest operable distance for the switch 18 (e.g., the farthest the activation field 88 or the activation area extends). In other words, the user of the switch 18 need only "touch" the projected image 42 to be close enough (e.g., within the activation field 88) to activate the switch 18.

Referring now to FIG. 3B, depicted is an alternate embodiment of the switch 18 including a light pipe 98. It will be understood that the light pipe 98 may be any type of waveguide. In the depicted embodiment, the second light source 34 is positioned below or on an opposite side of the substrate 22 from the holographic film 26. In other words, the second light source 34 is positioned proximate the B-surface 22B of the substrate 22. It will be understood that although only the second light source 34 is depicted as positioned on an opposite side of the substrate 22 than the holographic film 26, both the first and/or the second light sources 30, 34 may be positioned on an opposite side of the substrate 22 from the holographic film 26 (i.e., both the first and second light sources 30, 34 may be coupled to light guides). The light pipe 98 is optically coupled to the second light source 34 and is configured to carry the light to the holographic film 26. The light pipe 98 extends upwardly through the substrate 22, through the surround 72 and terminates above the holographic film 26. The end of the light pipe 98 is configured to emit new light onto the holographic film 26. The end of the light pipe 98 may be positioned above the surround 72, in the surround 72, in the well 76 or other areas proximate the holographic film 26. Further, the switch 18 may include multiple light pipes 98 all optically coupled to a single light source (e.g., the first or second light sources 30, 34) with each light pipe extending upwardly through the substrate 22 and through the surround 72 in different points such that a single light source emits light onto the holographic film 26 from more than one direction.

Figure 4:
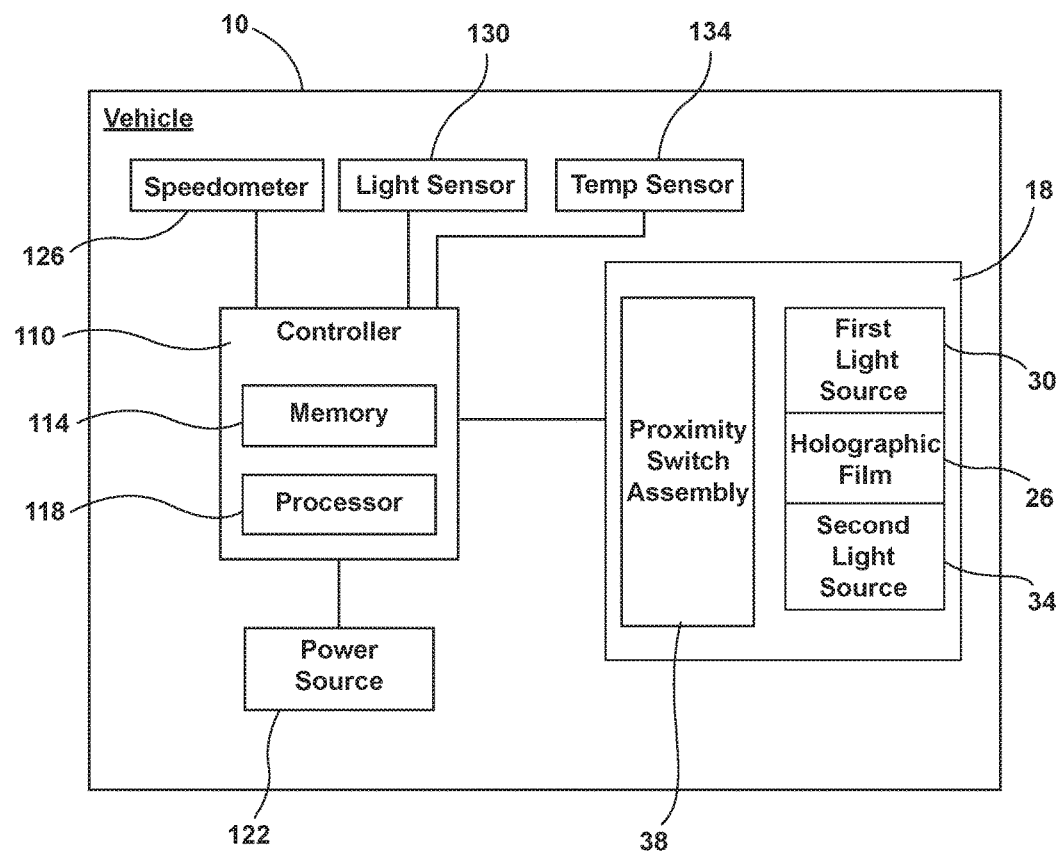
FIG. 4 is a block diagram further illustrating the vehicle, according to one embodiment.

Referring now to FIG. 4, depicted is a box diagram of the vehicle 10 in which the switch 18 is implemented. The vehicle 10 includes a controller 110 in communication with the switch 18. The controller 110 may include a memory 114 having instructions contained therein that are executed by a processor 118 of the controller 110. The controller 110 may provide electrical power to the switch 18 via a power supply 122 located onboard the vehicle 10. In addition, the controller 110 may be configured to control the light output of each of the first and second light sources 30, 34 based on feedback received from one or more vehicle control modules or sensors such as a speedometer 126, a light sensor 130 and/or a temperature sensor 134. The memory 114 may include a variety of routines configured to vary the color and intensity emitted by the first and/or second light sources 30, 34. For example, the first and second light sources 30, 34 may increase in brightness or change color to correspond with operating modes of the switches 18. In specific examples, the intensity of the first and second light sources 30, 34 may be altered relative to one another in order to make the projected image 42 appear to move or change color as explained above. Further, the intensity of the first and second light sources 30, 34 of one switch 18 (may be altered relative to the first and second light sources 30, 34 of another switch 18. For example, when a heated seat embodiment of the switch 18 is activated, a heated seat off switch 18 can be enhanced (e.g., color, intensity and/or movement change) such that the heated seat off switch 18 is enhanced relative to the heated seat on switch 18 such that is able to be quickly identified. In another embodiment, the memory 114 may include a routine to alternate the color, intensity and/or movement of the switches 18 based on data sensed from one or more of the sensors (e.g., the speedometer 126, light sensor 130 and/or the temperature sensor 134). In other words, the switch 18 may be electrically coupled one or more of the sensors. In a first example, sensor data from the light sensor 130 may be utilized to determine the ambient lighting conditions in which the vehicle 10 is present in order to increase or decrease the intensity of the light from the first and second light sources 30, 34 of the switch 18. Such an example may make the switch 18 more visible under the current lighting conditions of the vehicle 10. In a second example, speed data from the speedometer 126 may be used to enhance certain switches 18 to reduce driving distraction. For example, switches 18 commonly used by a driver during operation of the vehicle 10 may be enhanced (e.g., intensity, color and/or movement of the projected image 42) to make the switches 18 more visible to the driver while driving. In a third example, temperature data from the temperature sensor 134 may be utilized to enhance the perception of temperature related switches 18. For example, if the temperature sensor 134 detects a cold temperature exterior or interior to the vehicle 10, switches 18 relating to heating and/or defrosting controls can be enhanced (e.g., change color, movement and/or intensity) to highlight these switches 18 to the driver. It will be understood that the switches 18 for cooling (e.g., air conditioning, ventilated seats) may be enhanced when the temperature sensor 134 detects hot conditions exterior or interior to the vehicle 10.

Use of the present disclosure may offer a variety of advantages. First, use of the holographic film 26 and the first and second light sources 30, 34 may provide a projected image 42 which appears to be floating above the switch 18 and provides an intuitive identification of function of the switches 18 and enhanced aesthetic appearance as well as increase visibility. Second, use of the switch 18 in conjunction with vehicle sensors may allow the projected image 42 to vary interactively based on sensed conditions of the vehicle 10. Third, use of multiple light sources (e.g., first and second light sources 30, 34) allows for the projected image 42 to change in appearance or functional identification of the switch 18, by altering the appearance of the projected image 42 and the switch 18 through changing intensity, color and/or movement. The switches 18 may more readily stand out to the observer or driver thereby decreasing time required to identify the appropriate switch 18 which may reduce distracted driving and increase the safety of the vehicle 10.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims as interpreted according to the principles of patent law, including the doctrine of equivalents.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, and the nature or numeral of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further, it is to be understood that such concepts are intended to be covered by the following claims, unless these claims, by their language, expressly state otherwise. Further, the claims as set forth below, are incorporated into and constitute part of this Detailed Description.

What is claimed is:

1. A vehicle switch, comprising:
   a substrate;
   a holographic film positioned on the substrate;
   a first light source and a second light source configured to emit a light onto the holographic film; and
   a proximity switch assembly positioned on the substrate, wherein the holographic film is configured to create a projected image above the holographic film.

2. The vehicle switch of claim 1, wherein the proximity switch is configured to emit an activation field.

3. The vehicle switch of claim 2, wherein the projected image is displayed within the activation field.

4. The vehicle switch of claim 1, wherein at least one of the first and second light sources are positioned on an opposite side of the substrate than the holographic film.

5. The vehicle switch of claim 1, further comprising:
   a waveguide optically coupled with at least one of the first and second light sources.

6. The vehicle switch of claim 5, wherein the waveguide is configured to emit the light onto the holographic film.

7. The vehicle switch of claim 5, wherein the proximity switch assembly comprises a capacitive switch comprising one or more capacitive sensors.

8. The vehicle switch of claim 1, wherein the first and second light sources are positioned on opposite sides of the holographic film.

9. A vehicle switch, comprising:
   a substrate;
   a holographic film positioned on the substrate;
   a first light source and a second light source configured to emit a light onto the holographic film; and
   a proximity switch assembly positioned on an opposite side of the substrate than the holographic film, wherein the holographic film is configured to create a projected image.

10. The vehicle switch of claim 9, wherein at least one of the first and second light sources is electrically coupled to a light sensor.

11. The vehicle switch of claim 9, wherein at least one of the first and second light sources is electrically coupled to a speedometer.

12. The vehicle switch of claim 9, wherein the holographic film defines at least one interference pattern.

13. The vehicle switch of claim 9, wherein the proximity switch assembly comprises a capacitive switch comprising one or more capacitive sensors.

14. The vehicle switch of claim 9, wherein at least one of the first and second light sources are positioned on an opposite side of the substrate than the holographic film.

15. A switch, comprising:
a substrate;
a holographic film positioned on the substrate;
a light source configured to emit a light onto the film; and
a switch assembly positioned on the substrate, wherein the holographic film is configured to create a projected image above the switch assembly.

16. The switch of claim 15, further comprising:
a second light source positioned proximate the holographic film, the first and second light sources positioned to emit light onto the holographic film from different directions.

17. The switch of claim 16, wherein the switch assembly is a proximity switch assembly configured to generate an activation field and wherein the projected image is within the activation field.

18. The switch of claim 17, wherein the proximity switch assembly comprises a capacitive switch comprising one or more capacitive sensors.

19. The switch of claim 18, wherein the light source is configured to emit coherent light.

20. The switch of claim 19, wherein the proximity switch assembly is in a vehicle.

* * * * *